United States Patent
Gronlund (10) Patent No.: US 7,751,275 B2
(45) Date of Patent: Jul. 6, 2010

(54) DOUBLE DATA RATE-SINGLE DATA RATE INPUT BLOCK AND METHOD FOR USING SAME

(75) Inventor: Christopher Gronlund, Kent, WA (US)

(73) Assignee: Broadcom Corporation, Irvine, CA (US)

( * ) Notice: Subject to any disclaimer, the term of this patent is extended or adjusted under 35 U.S.C. 154(b) by 80 days.

(21) Appl. No.: 12/011,351

(22) Filed: Jan. 25, 2008

(65) Prior Publication Data

US 2009/0190431 A1    Jul. 30, 2009

(51) Int. Cl.
G11C 8/16    (2006.01)

(52) U.S. Cl. ............. 365/233.13; 365/194; 365/233.11; 365/233.12

(58) Field of Classification Search ............ 365/233.13, 365/233.1, 233.11, 233.12, 194
See application file for complete search history.

(56) References Cited

U.S. PATENT DOCUMENTS

| | | | | |
|---|---|---|---|---|
| 6,154,393 A | * | 11/2000 | Otsuka et al. ........ | 365/189.02 |
| 6,493,285 B1 | * | 12/2002 | Wolford ............... | 365/185.17 |
| 6,665,230 B1 | * | 12/2003 | Shrader et al. ........ | 365/233.13 |
| 7,116,589 B2 | * | 10/2006 | Stubbs ................ | 365/194 |
| 7,460,431 B1 | * | 12/2008 | Pan et al. ............. | 365/233.13 |

\* cited by examiner

*Primary Examiner*—Pho M. Luu
(74) *Attorney, Agent, or Firm*—Farjami & Farjami LLP

(57) ABSTRACT

Disclosed is a double data rate (DDR) input block comprising first and second input registers corresponding to a DDR input of the DDR input block. The first and second input registers are coupled to the DDR input. The DDR input block is configured to load a first data into the first input register and a second data into the second input register during a single clock cycle of a system clock, thereby operating at double data input during a single clock cycle. A single data rate/ double data rate (SDR/DDR) input block may be operated in either SDR or DDR mode. The DDR input block may be used with a scannable output reduction block. The DDR input block may be used in systems utilizing a content addressable memory (CAM) or a random access memory (RAM), or other types of memory devices.

20 Claims, 6 Drawing Sheets

DOUBLE DATA RATE-SINGLE DATA RATE INPUT BLOCK AND METHOD FOR USING SAME

BACKGROUND OF THE INVENTION

1. Field of the Invention

The present invention is generally in the field of electrical circuits and systems. More specifically, the present invention is in the field of memory devices.

2. Background Art

In various memory devices, such as RAMs (random access memory), CAMs (content addressable memory), or other memory devices, that handle a large amount of input data, the number of inputs to the memory device need be managed and reduced to, for example, reduce problems associated with data routing when there are numerous input pins. However, the reduction of the number of inputs need be accomplished without impairing the ability of the memory device to handle a large amount of input data. Moreover, it is desirable to preserve flexibility so that various system design requirements in receiving input data can be met.

For example, if a system is capable of providing write or compare data at a high rate into a RAM or a CAM, then it is desirable to utilize the high data rate advantageously so that data can be received by the RAM or CAM at a faster pace. On the other hand, if a system is not capable of providing data at a high rate into a RAM or CAM, then it is desirable to accommodate the slower data rate as well. In this manner a system designer can utilize fewer input pins of the RAM or CAM for providing input data, or can use a more conventional data rate which requires a greater number of input pins. The capability to provide and receive data at higher rates results in speed improvement, and a reduction of input pins and reduces input/output (I/O) routing complexity in memory devices, such as RAMs and CAMs.

Thus, it is desirable to maintain flexibility to accommodate receiving data at various data rates, and to switch between a slower incoming data rate and a faster incoming data rate in various memory devices, such as RAMs, CAM, as well as other memory devices.

SUMMARY OF THE INVENTION

A double data rate-single data rate input block and method for using same, substantially as shown in and/or described in connection with at least one of the figures, and as set forth more completely in the claims.

DETAILED DESCRIPTION OF THE INVENTION

The present invention is directed to a double data rate-single data rate input block and method for using same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1A:
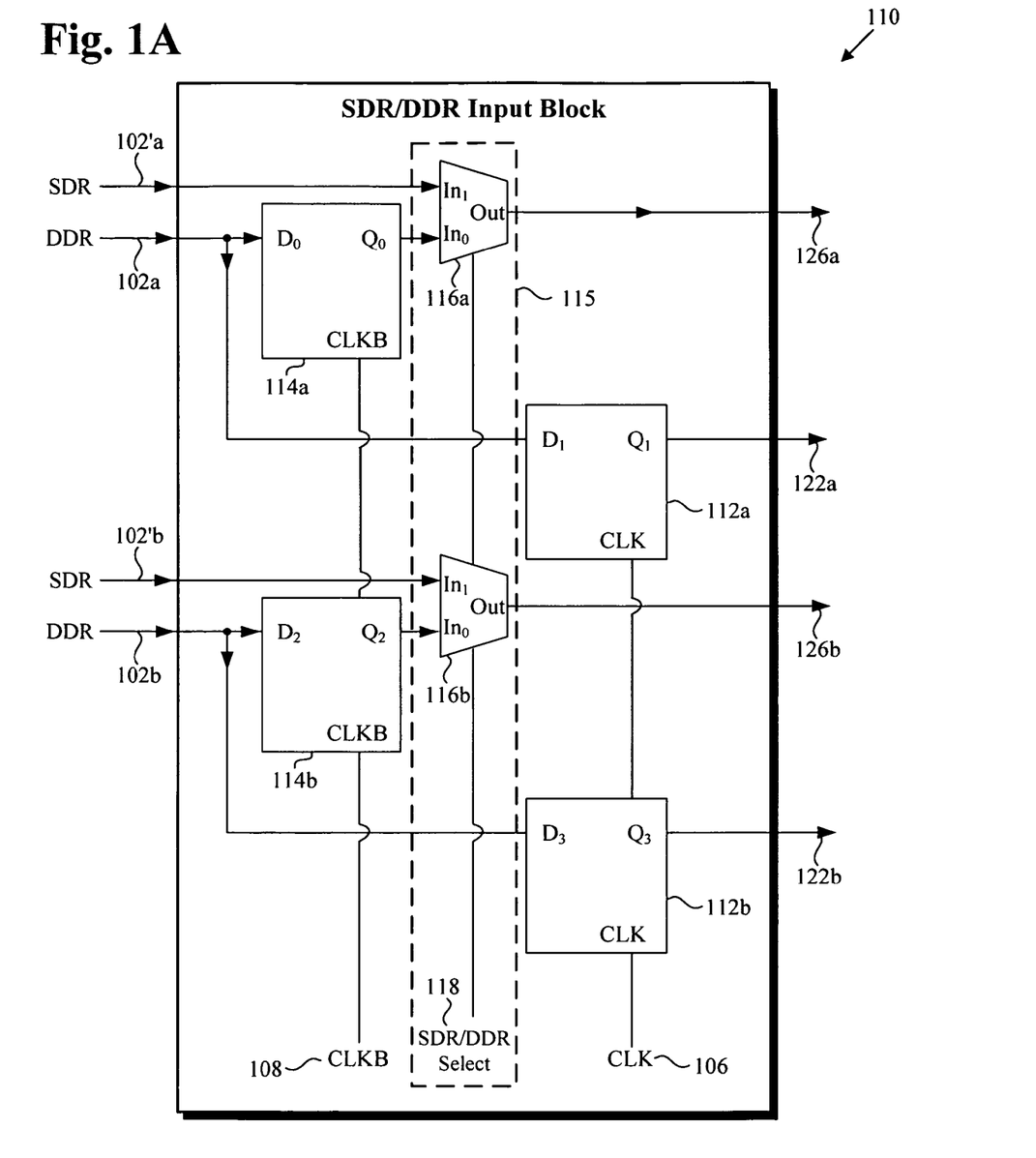
FIG. 1A shows an exemplary single data rate/double data rate input block, according to one embodiment of the present invention.

FIG. 1A shows exemplary single data rate/double data rate (SDR/DDR) input block 110, according to one embodiment of the present invention. SDR/DDR input block 110 in FIG. 1 can be used in a variety of memory devices, such as CAMs, RAMs, or the like, where it is important to preserve flexibility in input data rate and/or to reduce the number of input pins in order to reduce I/O routing complexity in the memory device.

In this exemplary embodiment, SDR/DDR input block 110 comprises SDR inputs 102'a and 102'b, DDR inputs 102a and 102b, first input registers 112a and 112b, second input registers 114a and 114b, and outputs 126a, 122a, 126b, and 122b. SDR/DDR input block 110 further comprises SDR input circuit 115 including SDR/DDR select controller 118 and multiplexers 116a and 116b. As shown in FIG. 1A, SDR/DDR input block 110 has first input registers 112a and 112b triggered by clock 106, which may be a system clock, for example. As further shown in FIG. 1A, second input registers 114a and 114b are triggered by clockB 108, which may be a secondary clock providing a timing signal that is the complement to clock 106. It is noted that although in the embodiment of FIG. 1A, first input registers 112a and 112b, and second input registers 114a and 114b are shown to comprise D flip-flops, that representation is merely exemplary. For, while SDR/DDR input reduction block 110 comprises D flip-flops 112a and 112b, and 114a and 114b, triggered by clock 106 and clockB 108, respectively, in another embodiment, both the first and the second input registers may be driven by a single system clock, such as clock 106. In that embodiment, first input registers 112a and 112b may comprise typical D flip-flops triggered by the rising edge (i.e. positive edge) of clock 106, while second input registers 114a and 114b may comprise negative edge latches, for example.

According to the embodiment of FIG. 1A, SDR/DDR input block 110 is capable of operating in either SDR or DDR mode. DDR mode operation will be described in greater detail in conjunction with following FIG. 1B. To avoid unnecessary repetition, the present description of FIG. 1A will focus on SDR mode operation. As may be seen from FIG. 1A, SDR operation is enabled by SDR/DDR select controller 118, which regulates multiplexers 116a and 116b. When SDR mode is selected, corresponding to a HIGH output from SDR/DDR select controller 118, for example, multiplexers 116a and 116b load input data provided at their respective In, inputs, while effectively blocking data provided at their respective $In_0$ inputs. As a result, when SDR mode is selected, DDR inputs 102a and 102b may be ignored, and data processing proceeds through SDR inputs 102'a and 102'b.

Continuing with FIG. 1A and SDR/DDR input block 110 operating in SDR mode, when SDR input data is received by SDR/DDR input block 110 at SDR inputs 102'a and 102'b, that SDR input data is routed to the $In_1$ inputs to respective multiplexers 116a and 116b and passed on to outputs 126a and 126b. As a result, SDR/DDR input block 110 may be utilized in SDR mode as a pass through input interface where or when DDR input mode is not utilized. At the same time, SDR/DDR input block 110 has the flexibility to operate in DDR mode, where system conditions make that operating mode desirable, for example to reduce the number of system inputs.

Figure 1B:
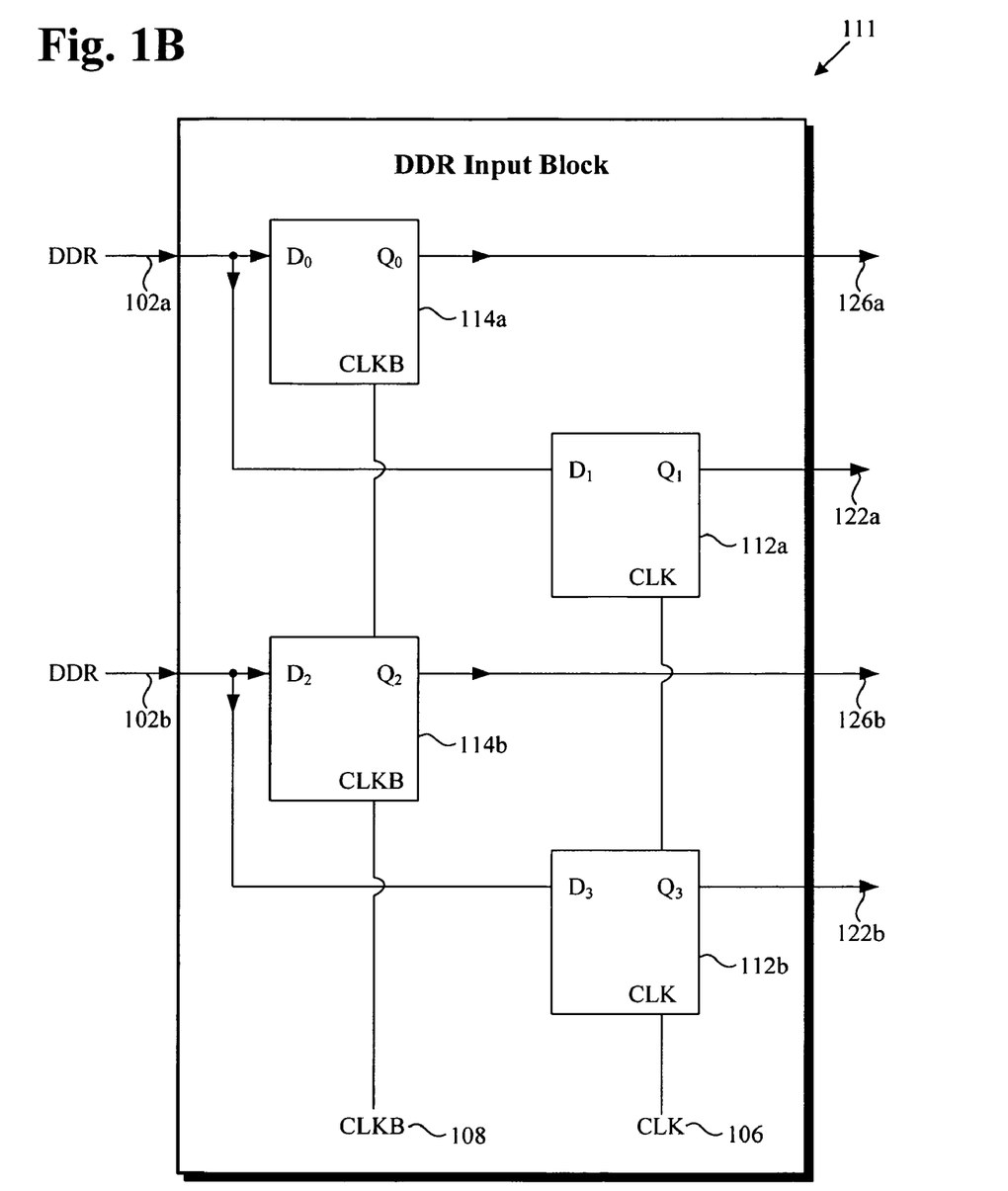
FIG. 1B shows an exemplary double data rate input block, according to one embodiment of the present invention.

Referring now to FIG. 1B for a description of DDR mode operation, FIG. 1B shows an exemplary DDR input block, according to one embodiment of the present invention. DDR input block 111 in FIG. 1B comprises DDR inputs 102a and 102b, first input registers 112a and 112b, second input registers 114a and 114b, and outputs 126a, 122a, 126b, and 122b, corresponding respectively to their similarly numbered equivalents in SDR/DDR input block 110, in FIG. 1A. The following description of DDR input block 111 in FIG. 1B is equally applicable to SDR/DDR input block 110, in FIG. 1A, operating in DDR mode. It is noted that for SDR/DDR input block 110, when DDR mode is selected, corresponding to a LOW output from SDR/DDR select controller 118, for example, multiplexers 116a and 116b load input data provided at their respective $In_0$ inputs, while effectively blocking data provided at their respective $In_1$ inputs. As a result, when DDR mode is selected, SDR inputs 102'a and 102'b may be disregarded, and data processing proceeds through DDR inputs 102a and 102b.

Returning to FIG. 1B, DDR input block 111 is configured to receive a first data and a second data at each DDR input 102a and 102b. DDR input block 111 includes a first input register corresponding to each input and a second input register corresponding to each input. This relationship is shown in FIG. 1B by first input register 112a and second input register 114a corresponding to input 102a, and by first input register 112b and second input register 114b corresponding to input 102b. For ease and brevity of description, data flow in DDR input block 111 will be described for input 102a, first input register 112a, and second input register 114a only. It should be understood that substantially the same events occur for data received at input 102b and processed through first input register 112b and second input register 114b.

Continuing with FIG. 1B, when a first data is received by DDR input block 111, that first data is routed to inputs to both first input register 112a and second input register 114a. At the next rising edge of clock 106, for example, that first data may be loaded into first input register 112a and made available at output $Q_1$ of first input register 112a. The first data will not be loaded into second input register 114a, however, because second input register 114a is regulated by clockB 108, which may be low when clock 106 is high, and high when clock 106 is low. Analogously, when a second data is received at DDR input 102a during the present cycle of clock 106, the second data is routed to the inputs of both first input register 112a and second input register 114a, but loaded only into second input register 114a on a rising edge of clockB 108. Moreover, the second data is made available at output $Q_0$ of second input register 114a during the present cycle of clock 106, so that DDR input block 111 is configured to receive double data at DDR input 102a during a single clock cycle of clock 106 and provide that data at outputs 126a and 122a. Similarly, a first and second data received at DDR input 102b during the present clock cycle of clock 106 is provided as outputs 126b and 122b.

Although in the embodiment of FIG. 1B, all respective input registers are shown to trigger on a rising edge of clock 106 and clockB 108, triggering can occur differently in other embodiments in which the first input registers, or the second input registers, may be negative edge latches, for example. More generally, then, first input registers 112a and 112b may be seen to load the first data by a leading edge of clock 106, where that leading edge may be a rising or falling edge. Second input registers 114a and 114b may then load the second data by a leading edge of clockB 108, where a secondary clock is used, or by a following edge—either rising or falling—of clock 106.

Thus, the embodiment of FIG. 1B utilizes separately triggered first input registers and second input registers to load first and second data received at each input of DDR input block 111 during a single cycle of clock 106. As a result, DDR input block 111 is capable of receiving double data through each DDR input (e.g. DDR input 102a) during a single system clock cycle, and supplying two data outputs (e.g. data outputs 126a and 122a) corresponding to each DDR input during every clock cycle, thereby providing a two-to-one reduction in the number of inputs required to accommodate a given data flow through DDR input block 111.

Figure 2:
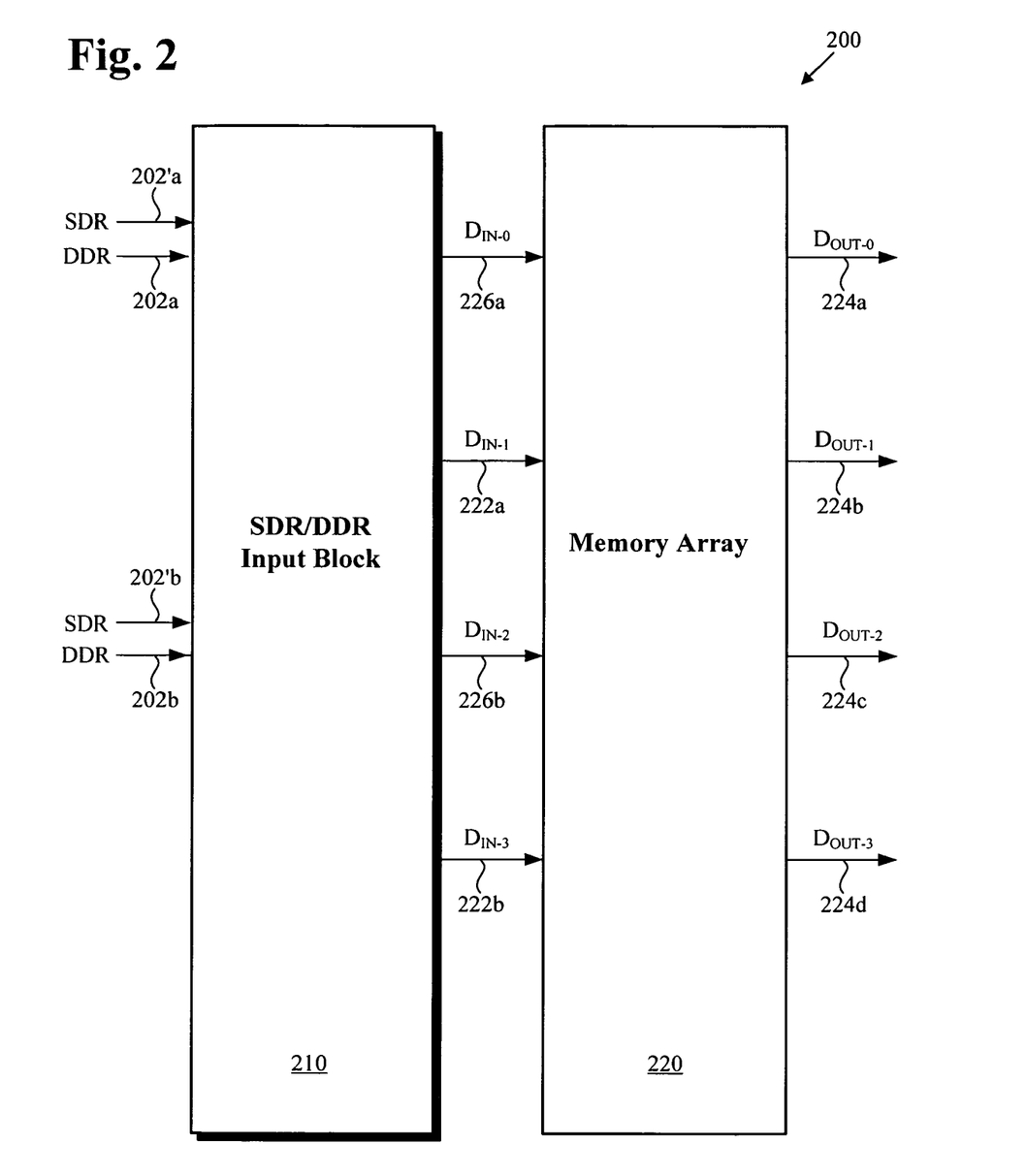
FIG. 2 shows a block diagram of a system utilizing a single data rate/double data rate input block in combination with a memory array, according to one embodiment of the present invention.

Turning to FIG. 2, FIG. 2 shows a block diagram of a system utilizing an SDR/DDR input block in combination with a memory array, according to one embodiment of the present invention. System 200 in FIG. 2 comprises SDR/DDR input reduction block 210 and memory array 220. SDR/DDR input reduction block 210 receiving SDR inputs 202'a and 202'b or DDR inputs 202a and 202b, and providing outputs 226a, 222a, 226b, and 222b, corresponds to SDR/DDR input reduction block 110 receiving SDR inputs 102'a and 102'b or DDR inputs 102a and 102b, and providing outputs 126a, 122a, 126b, and 122b, in FIG. 1A.

As seen from system 200, when SDR/DDR input block 210 is operating in DDR mode, memory array 220 is configured to receive respective first data and second data provided to DDR input 202a, as outputs 226a and 222a from SDR/DDR input block 210. Likewise, in the DDR mode, memory array 220 receives respective first data and second data provided to DDR input 202b, as outputs 226b and 222b from SDR/DDR input block 210. Data received from SDR/DDR input reduction block 210 at respective DDR inputs 202a and 202b are shown in system 200 as data inputs $D_{IN-0}$, $D_{IN-1}$, $D_{IN-2}$, and $D_{IN-3}$ to memory array 220. Also shown in FIG. 2 are memory array outputs 224a, 224b, 224c, and 224d, comprising memory array output data $D_{OUT-0}$, $D_{OUT-1}$, $D_{OUT-2}$, and $D_{OUT-3}$, respectively. As shown in FIG. 2, when SDR/DDR input block 210 is implemented as a DDR input interface to memory array 220, which may be a content addressable memory (CAM) array or random access memory (RAM), for example, SDR/DDR input block 210 advantageously enables a two-to-one reduction in the number of inputs required to perform a required operation, such as a write operation, a compare operation, or the like.

Figure 3:
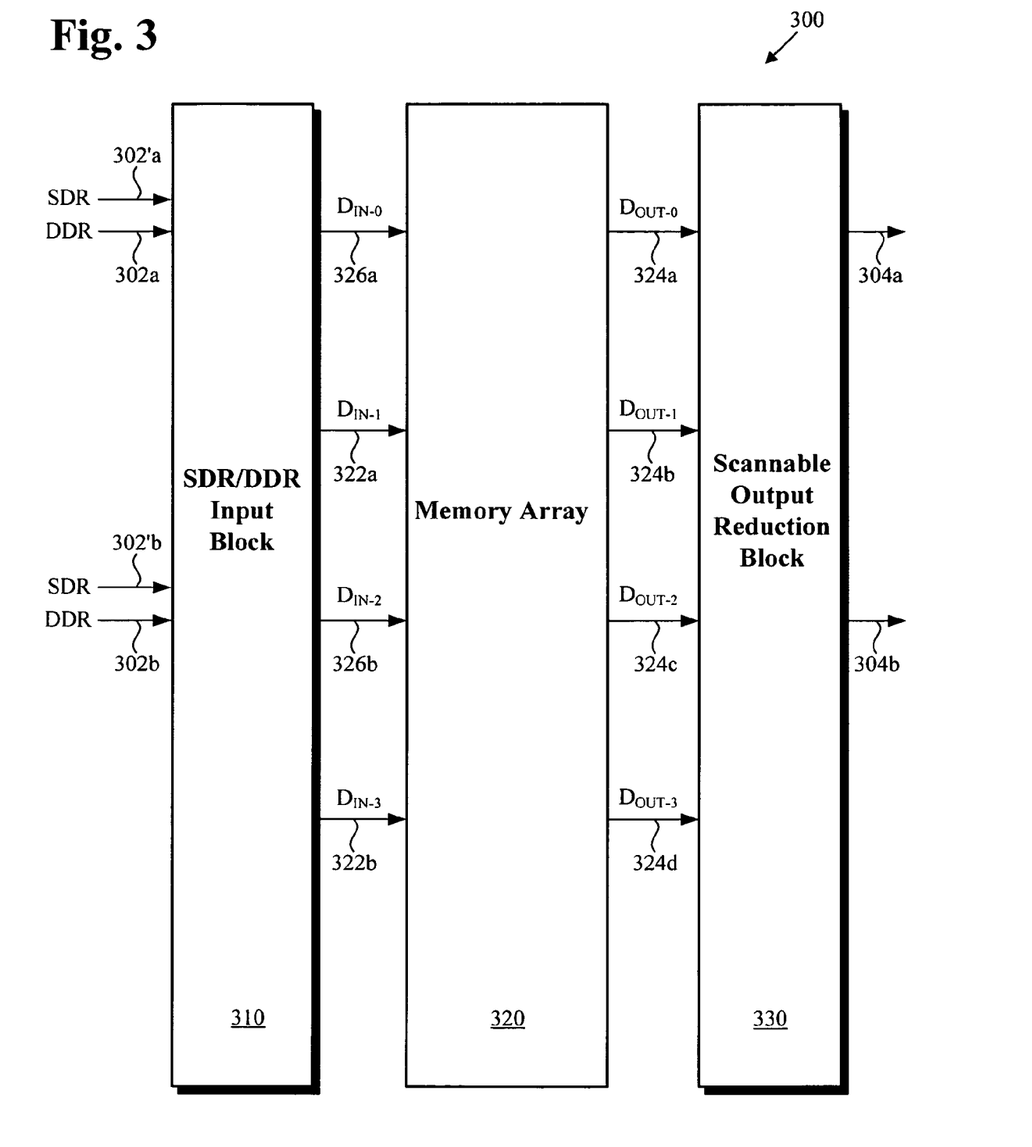
FIG. 3 shows a block diagram of a system utilizing a single data rate/double data rate input block in combination with a memory array, including a scannable output reduction block, according to one embodiment of the present invention.

FIG. 3 shows a block diagram of a system utilizing an SDR/DDR input block in combination with a memory array, including a scannable output reduction block, according to one embodiment of the present invention. System 300 in FIG. 3 comprises SDR/DDR input reduction block 310, memory array 320, and scannable output reduction block 330. SDR/DDR input reduction block 310 receiving SDR inputs 302'a and 302'b or DDR inputs 302a and 302b, and providing outputs 326a, 322a, 326b, and 322b, corresponds to SDR/DDR input reduction block 110 receiving SDR inputs 102'a and 102'b or DDR inputs 102a and 102b, and providing outputs 126a, 122a, 126b, and 122b, in FIG. 1A. Memory array 320, in FIG. 3, receiving data inputs $D_{IN-0}$, $D_{IN-1}$, $D_{IN-2}$, and $D_{IN-3}$, and providing outputs 324a, 324b, 324c, and 324d, comprising data $D_{OUT-0}$, $D_{OUT-1}$, $D_{OUT-2}$, and $D_{OUT-3}$, respectively, corresponds to memory array 220 in FIG. 2.

As shown in FIG. 3, scannable output reduction block 330 receives outputs 324a, 324b, 324c, and 324d from memory array 320, and provides system outputs 304a and 304b. As a result, data $D_{OUT-0}$ and $D_{OUT-1}$, and $D_{OUT-2}$ and $D_{OUT-3}$, may be read from memory array 320 using scannable output reduction block 330. Scannable output block 330, in FIG. 3, is configured to selectively reduce the number of outputs from system 300. A more detailed exemplary implementation of scannable output reduction block 330 will follow in FIG. 4.

When utilized in combination with SDR/DDR input block 310, scannable output reduction block 330 is capable of producing a reduction in the outputs from system 300, thus providing system 300 with a routing solution enabling greater flexibility. Although in the embodiment of FIG. 3, the reduction in outputs provided by scannable output s reduction block 330 is a two-to-one reduction, and matches the two-to-one reduction in inputs provided by SDR/DDR input block 310 operating in DDR mode, which produces a symmetrical routing solution, in other embodiments, the input and output reduction need not match.

Figure 4:
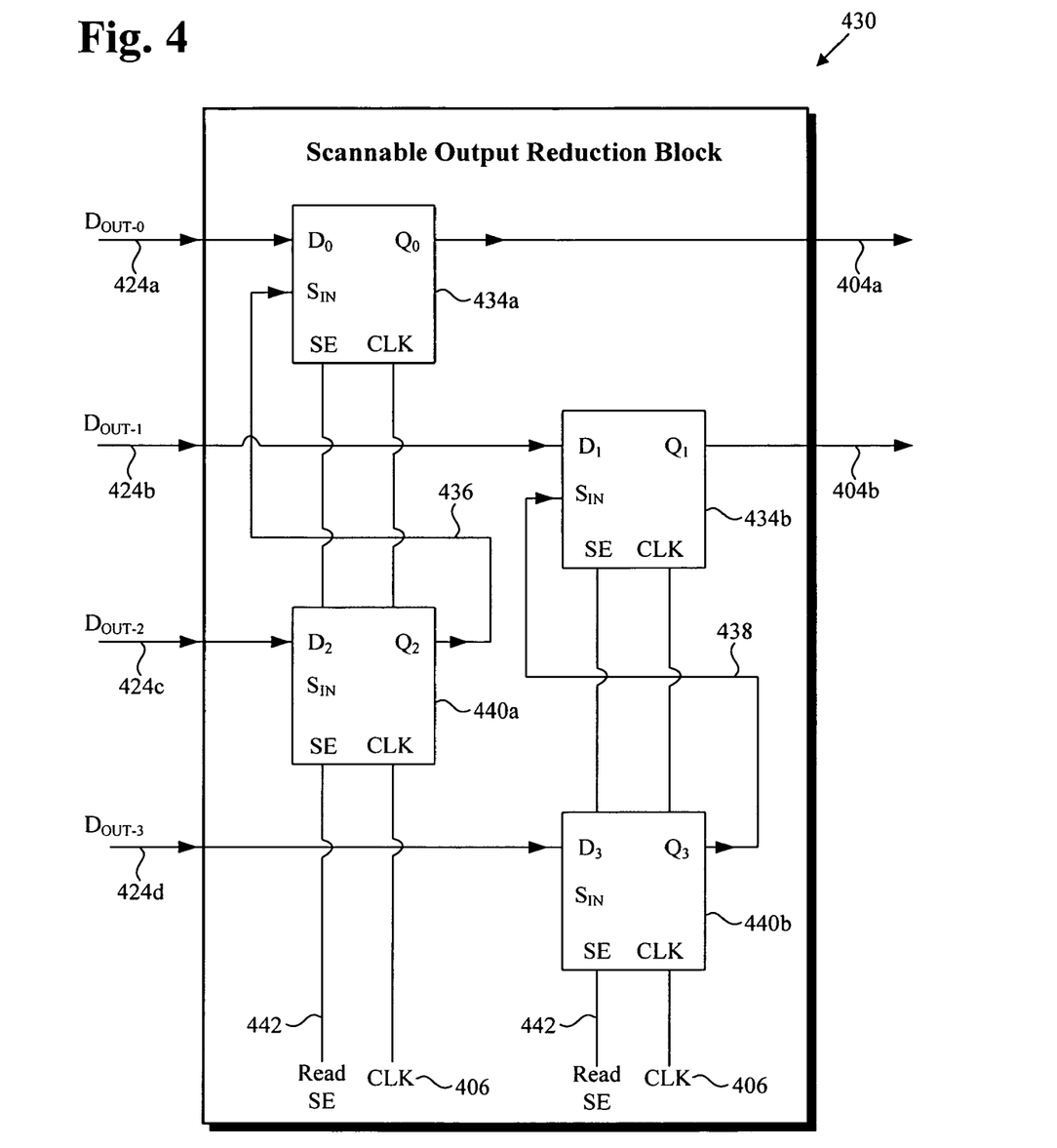
FIG. 4 shows an exemplary scannable output reduction block suitable for use in the system of FIG. 3, according to one embodiment of the present invention.

Turning now to FIG. 4, FIG. 4 shows an exemplary scannable output reduction block suitable for use in system 300 of FIG. 3, according to one embodiment of the present invention. Scannable output reduction block 430 receiving first pair of data outputs $D_{OUT-0}$ and $D_{OUT-1}$, and second pair of data outputs $D_{OUT-2}$ and $D_{OUT-3}$ from a memory array (not shown in FIG. 4), and providing outputs 404a and 404b, corresponds to scannable output reduction block 330 receiving first pair of data outputs $D_{OUT-0}$ and $D_{OUT-1}$, and second pair of data outputs $D_{OUT-2}$ and $D_{OUT-3}$ from memory array 320 and providing system outputs 304a and 304b in FIG. 3.

Scannable output reduction block 430 in FIG. 4 comprises inputs 424a, 424b, 424c, 424d, first output register 434a, second output register 434b, first primary scan chain register 440a, and second primary scan chain register 440b. First output register 434a, second output register 434b, first primary scan chain register 440a, and second primary scan chain register 440b may be D flip-flops, for example. Also included in scannable output reduction block 430 are outputs 404a and 404b, clock 406, and Read SE control line 442. As shown in FIG. 4, first output register 434a, second output register 434b, first primary scan chain register 440a, and second primary scan chain register 440b are triggered by clock 406, which may be a system clock corresponding to clock 106 in FIG. 1, for example. As further shown in FIG. 4, first output register 434a, second output register 434b, first primary scan chain register 440a, and second primary scan chain register 440b are controlled by Read SE control line 442, which determines whether the respective registers are loaded by data provided at inputs $D_0$, $D_1$, $D_2$, and $D_3$, or scanned in as inputs to $S_{IN}$.

According to the embodiment of FIG. 4, scannable output reduction block 430 contains two scan chains, each corresponding to an output of scannable output reduction block 430, and each including one output register and a primary scan chain register. First output register 434a and first primary scan chain register 440a, linked by scan line 436, comprise a first scan chain corresponding to output 404a, while second output register 434b and second primary scan chain register 440b, linked by scan line 438, comprise a second scan chain corresponding to output 404b. It is noted that this is a purely exemplary arrangement, however. In other embodiments, scannable output reduction block 430 can have more scan chains corresponding to more outputs, and each scan chain may include additional scan chain registers. For example, in one exemplary embodiment, a scannable output reduction block may comprise eight scan chains, each including an output register, primary scan chain register, secondary scan chain register, and tertiary scan chain register. It is further noted that although in the present embodiment the number of registers included in a scan chain matches the number of scan chains in scannable output reduction block 430, in other embodiments that may not be the case.

Continuing with FIG. 4, when a first pair of first and second data and a second pair of first and second data, corresponding respectively to $D_{OUT-0}$ and $D_{OUT-1}$, and $D_{OUT-2}$ and $D_{OUT-3}$ is received by scannable output reduction block 430, the first pair of data is routed to respective first and second output registers 434a and 434b, while the second pair of data is routed to first and second primary scan chain registers 440a and 440b. During a first read cycle, triggered by clock 406, first and second output registers 434a and 434b provide the first pair of first and second data, i.e. $D_{OUT-0}$ and $D_{OUT-1}$ at respective outputs 404a and 404b. In addition, first and second primary scan chain register 440a and 440b deliver the second pair of first and second data, i.e. $D_{OUT-2}$ and $D_{OUT-3}$ to the respective $S_{IN}$ inputs of first and second output registers 434a and 434b. Read SE control line 442, which may initially be low to allow data input to the respective registers at $D_0$, $D_1$, $D_2$, and $D_3$, transitions high during the first read cycle. As a result, during a second read cycle triggered by clock 406, the second pair of first and second data are read from outputs 404a and 404b of scannable output reduction block 430.

As can be seen from FIG. 4, the present embodiment enables a two-to-one reduction in the outputs from a memory system. In other embodiments utilizing scan chains having more numerous scan chain registers, the output reduction can be correspondingly greater. According to the embodiment of FIG. 4, reductions in output come at the expense of additional cycle time, as the second pair of first and second data are first scanned into the output registers prior to being read out during a subsequent read cycle. This approach may prove advantageous, however, for example in a RAM performing proportionally more write operations than read operations, or in a CAM capable of performing a compare operation concurrently with a read cycle.

Figure 5:
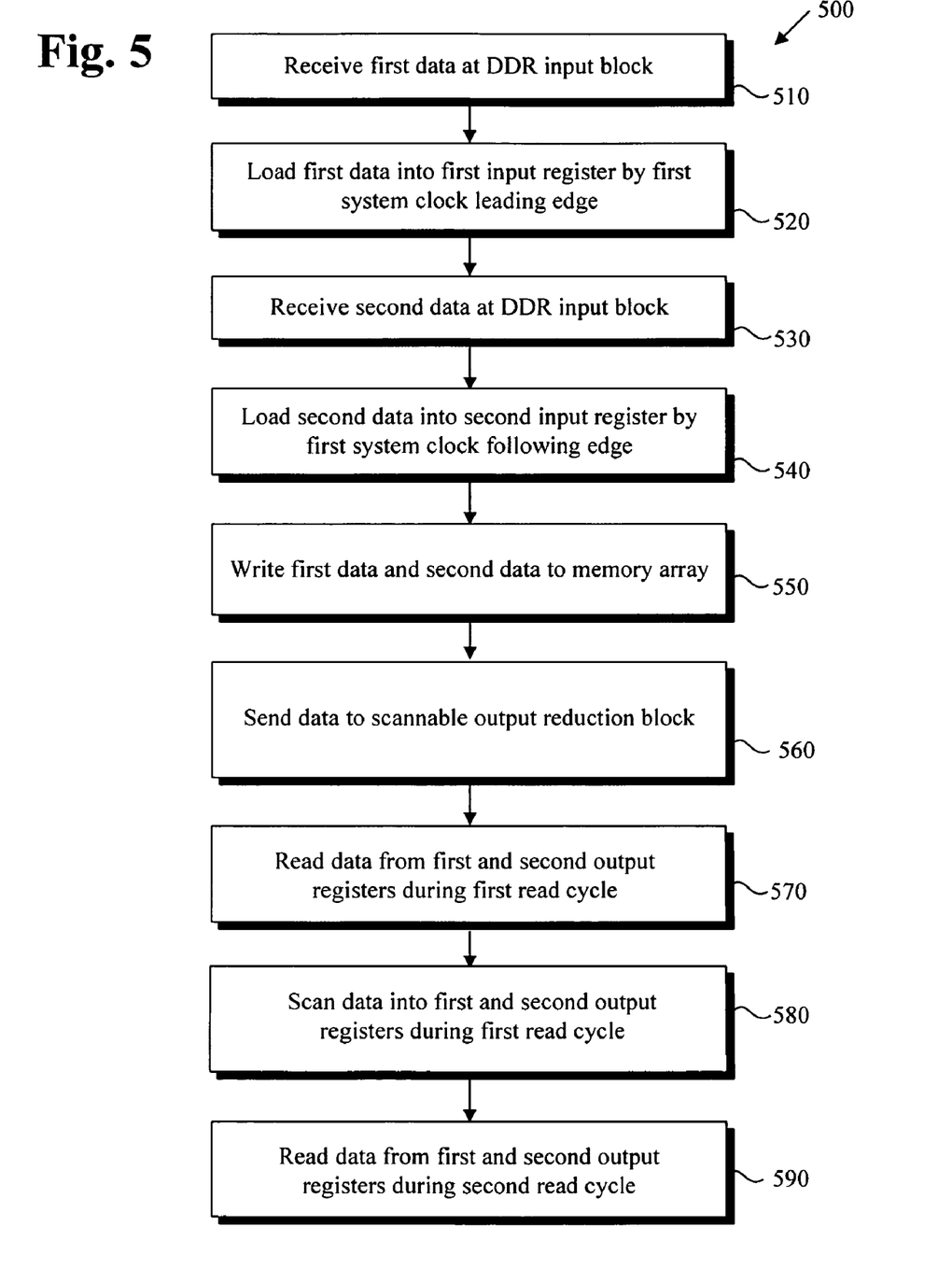
FIG. 5 shows a flowchart of a method of using a double data rate input block, according to one embodiment of the present invention.

FIG. 5 shows flowchart 500 describing the steps, according to one embodiment of the present invention, of a method of utilizing a DDR input block to reduce the number of inputs to a memory array. The present method may be implemented using a dedicated DDR input block, such as DDR input block 111 in FIG. 1B, or using an SDR/DDR input block operating in DDR mode, such as SDR/DDR input block 110 in FIG. 1A having SDR/DDR select set to LOW. Certain details and features have been left out of flowchart 500 that are apparent to a person of ordinary skill in the art. For example, a step may comprise one or more substeps or may involve specialized circuits or devices as known in the art. While steps 510 through 590 indicated in flowchart 500 are sufficient to describe one embodiment of the present invention, other embodiments of the invention may utilize steps different from those shown in flowchart 500.

Referring to the steps of flowchart 500 in conjunction with FIG. 1B, FIG. 3, and FIG. 4, step 510 of flowchart 500 comprises receiving a first data at an input to a DDR input block. As previously explained in relation to FIG. 1B, when a first data is received by DDR input reduction block 111, that first data is routed to inputs to both first input register 112a and second input register 114a. At a first leading edge of system clock 106, that first data is loaded into first input register 112a in step 520 of flowchart 500. As explained, although routed to second input register 114a as well, the first data will not be concurrently loaded into second input register 114a because it is regulated by a secondary clock signal, which in the embodiment of FIG. 5 is a falling edge of the system clock, but in another embodiment may be provided by a true secondary clock.

Thus, when a second data is received at DDR input 102a in step 530, the second data is routed to the inputs of both first input register 112a and second input register 114a as well, but loaded only into second input register 114a on a first system clock following edge in step 540. Because, according to the present embodiment, the first data is loaded into the first input register by the first leading edge of the system clock in step 520, and the second data is loaded into the second input register by the first following edge of the system clock in step 540, the present method enables loading of double data through a single input to the DDR input block during a single clock cycle.

Step 550 of flowchart 500 comprises writing the first data and the second data to a memory array, which may comprise a CAM or RAM, for example. Continuing with step 560 of flowchart 500, step 560 comprises sending data to a scannable output reduction block. As described in relation to FIG. 4, the scannable output reduction block is capable of receiving data from the memory array, loading into a scan chain comprising scan chain registers and output registers, and reading data from the output registers during a read cycle.

Referring to step 570 of flowchart 500, step 570 comprises reading data from first and second output registers of the scannable output reduction block during a first read cycle. Step 570 corresponds to first and second output registers 434a and 434b providing data $D_{OUT-0}$ and $D_{OUT-1}$ at outputs 404a and 404b, in FIG. 4. Step 580 comprises scanning data $D_{OUT-2}$ and $D_{OUT-3}$ in FIG. 4, from first and second primary scan chain registers 440a and 440b in that figure, to first and second output registers 434a and 434b. In subsequent step 590 data $D_{OUT-2}$ and $D_{OUT-3}$ are read from the output registers during a second read cycle.

By providing a DDR input block capable of loading two sets of data through a single input, the present invention provides a data routing implementation capable of reducing the number of inputs to an electronic system, such as a memory array. Moreover, by loading the two sets of data during a single system clock cycle, the present invention provides an approach making it possible to advantageously reduce the number of inputs to an electronic system without reducing data throughput. By providing an SDR/DDR input block capable of receiving data in either SDR or DDR mode, the present invention provides flexibility under circumstances in which SDR data processing may be desirable. By further providing a scannable output reduction block, the present invention results in a system and method enabling reductions to both data inputs and data outputs.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a double data rate-single data rate input block and method for using same have been described.

The invention claimed is:

1. A double data rate (DDR) input block comprising:
a first input register coupled to a DDR input of said DDR input block;
a second input register coupled to said DDR input;
said DDR input block configured to load a first data from said DDR input into said first input register and a second data from said DDR input into said second input register during a single clock cycle of a system clock, thereby operating at double data rate during said single clock cycle of said system clock.

2. The DDR input block of claim 1, further configured to load said first data into said first input register by a leading edge of said system clock and to load said second data into said second input register by a following edge of said system clock.

3. The DDR input block of claim 2, wherein said leading edge is a rising edge of said system clock, and said following edge is a falling edge of said system clock.

4. The DDR input block of claim 2, wherein said leading edge is a falling edge of said system clock, and said following edge is a rising edge of said system clock.

5. The DDR input block of claim 1, further comprising a single data rate (SDR) input circuit configured to pass an SDR input when an SDR mode is selected.

6. The DDR input block of claim 1, further comprising a single data rate (SDR) input circuit including a multiplexer, said multiplexer configured to pass an SDR input when an SDR mode is selected.

7. The DDR input block of claim 1 utilized in a system to reduce a number of inputs to a memory array in said system.

8. The DDR input block of claim 7, wherein said system further comprises a scannable output reduction block configured to receive data from said memory array.

9. The DDR input block of claim 7, wherein said memory array is a content addressable memory (CAM) array.

10. A system utilizing a double data rate (DDR) input block coupled to and configured to provide data to a memory array, said system comprising:
a first input register and a second input register coupled to a DDR input;
said DDR input block configured to load a first data from said DDR input into said first input register and a second data from said DDR input into said second input register during a single clock cycle of a system clock, thereby providing double data rate input to said memory array during said single clock cycle of said system clock.

11. The system of claim 10, further configured to load said first data into said first input register by a leading edge of said system clock and to load said second data into said second input register by a following edge of said system clock.

12. The system of claim 10, further comprising a single data rate (SDR) input circuit configured to pass an SDR input to said memory array when an SDR Mode is selected.

13. The system of claim 10, further comprising a single data rate (SDR) input circuit including a multiplexer, said multiplexer configured to pass an SDR input to said memory array when an SDR mode is selected.

14. The system of claim 10, wherein said system further comprises a scannable output reduction block configured to receive data from said memory array.

15. A method of utilizing a double data rate (DDR) input block to reduce a number of inputs to a memory array, said method comprising steps of:
- receiving a first data at a DDR input of said DDR input block;
- loading said first data in a first input register of said DDR input block during a clock cycle of a system clock;
- receiving a second data at said DDR input of said DDR input block;
- loading said second data in a second input register of said DDR input block during said clock cycle of said system clock;
- providing said first data and said second data to said memory array during said clock cycle, thereby providing double data rate input to said memory array during said clock cycle of said system clock.

16. The method of claim 15, wherein said memory array comprises a content addressable memory (CAM) array.

17. The method of claim 15, wherein said memory array comprises a random access memory (RAM) array.

18. The method of claim 15, wherein said loading of said first data in said first input register is triggered by a leading edge of said system clock and said loading of said second data in said second input register is triggered by a following edge of said system clock.

19. The method of claim 18, wherein said leading edge is a rising edge of said system clock, and said following edge is a falling edge of said system clock.

20. The method of claim 18, wherein said leading edge is a falling edge of said system clock, and said following edge is a rising edge of said system clock.

* * * * *